United States Patent [19]

Kawata et al.

[11] Patent Number: 5,029,121
[45] Date of Patent: Jul. 2, 1991

[54] DIGITAL FILTER PROCESSING DEVICE

[75] Inventors: Tetsuro Kawata; Eiri Hashimoto; Nobuaki Miyakawa, all of Kanagawa, Japan

[73] Assignee: Fuji Xerox Co., Ltd., Tokyo, Japan

[21] Appl. No.: 512,204

[22] Filed: Apr. 20, 1990

[30] Foreign Application Priority Data

Apr. 22, 1989 [JP] Japan .................................. 1-102184

[51] Int. Cl.$^5$ .............................................. G06F 15/31
[52] U.S. Cl. .............................................. 364/724.16
[58] Field of Search ........................ 364/724.16, 724.01

[56] References Cited

U.S. PATENT DOCUMENTS 4,701,956 10/1987 Katoh ........................... 364/724.1 X
4,939,684 7/1990 Gehrig et al. .................... 364/724.01

Primary Examiner—Dale M. Shaw
Assistant Examiner—Tan V. Mai
Attorney, Agent, or Firm—Finnegan, Henderson, Farabow, Garrett and Dunner

[57] ABSTRACT

A digital filter processing device includes at least a plurality of multipliers each for multiplying data signal by coefficient data, and an adder for adding together the multiplication results derived from the multipliers. The digital filter processing device further includes coefficient registers each for storing the coefficient data as is shifted so that a first effective digit of the coefficient data lies at the left end, shift-quantity registers provided in connection with the coefficient registers, and each for storing a quantity of shift equal to the shift quantity of the coefficient data, and barrel shifters each for shifting the digits of an output data from each of the multipliers by the shift quantity stored in each of the shift-quantity registers, in the opposite direction to that of the shift in each of the coefficient registers. The digital filter processing device may further include a second shift-quantity register for storing a second quantity of shift, and a second barrel shifter for shifting the digits of the output data of the adder by the second shift quantity.

2 Claims, 3 Drawing Sheets

FIG. 3(a) { COEFFICIENT DATA A₁  0 . 1 0 1 1 0 1 1 0
           COEFFICIENT DATA A₂  0 . 0 0 0 1 1 0 1 0 1 1 1
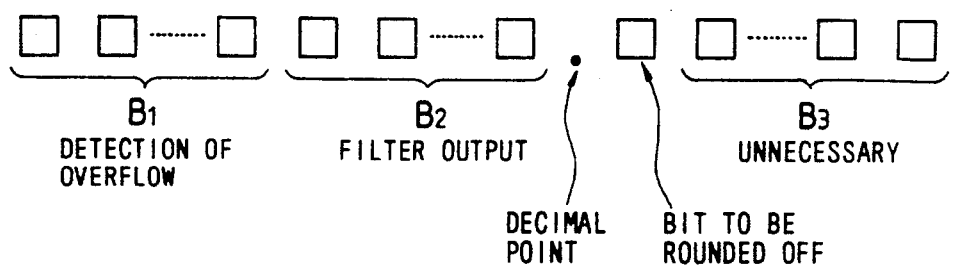
FIG. 3(c) { COEFFICIENT DATA A₁  1 0 1 1 0 1 1 0
           COEFFICIENT DATA A₂  1 1 0 1 0 1 1 1
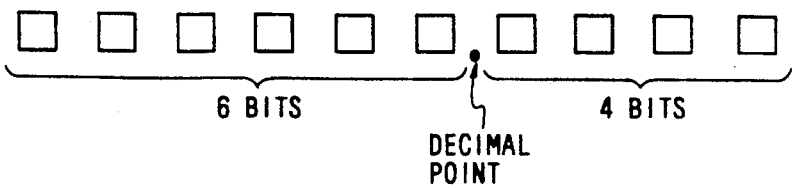
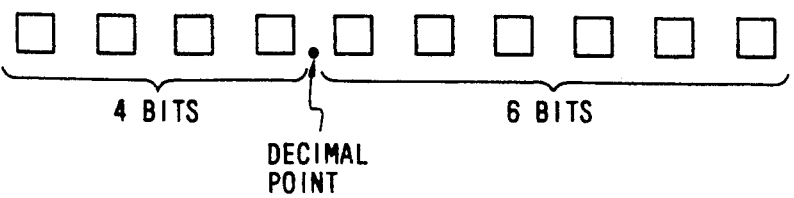

DIGITAL FILTER PROCESSING DEVICE

BACKGROUND OF THE INVENTION

The present invention relates to a digital filter processing device for digitally filtering data signal by the combination of multipliers, adders, and the like.

FIG. 2 shows in block form a conventional digital filter processing device. The device is a one-dimensional digital filter processing device with five taps. This type of the device is frequently fabricated into an LSI (large scale integrated circuit).

In FIG. 2, reference numerals 1—1 to 1-4 designate delay circuits; 2-1 to 2-5, coefficient registers 3-1 to 3-5, multipliers; 4, an adder; 5, a CPU (central processing unit) interface; 6, an input terminal; and 7, an output terminal.

A data signal applied to the input terminal 6 propagates through the delay circuits 1—1 to 1-4 while being successively delayed in synchronism with a clock signal (not shown). With the propagation, the data signal is also successively applied to multipliers as are provided in connection with the delay circuits. For example, the output data signal of the delay circuit 1—1 is transferred to the delay circuit 1-2, and also to the multiplier 3-2 provided in connection with the delay circuit.

With the connection of the delay circuits and the multipliers, the data signal outputted from the delay circuit 1-4 is the data as inputted four clocks ago. At that time, a total of five data signals as have been inputted for the past four clocks are inputted to the multipliers 3-1 to 3-5 simultaneously.

The coefficient data to be subjected to the multiplications for digital filter processing are stored in the coefficient registers 2-1 to 2-5. The coefficient data may be loaded into the registers through the CPU interface, from the CPU. The coefficient data stored are respectively transferred to the corresponding multipliers where those items of data are multiplied by the data signals.

The results of the multiplications are added together by the adder 4. The output data of the adder is outputted as filter output data from the output terminal 7.

The delay circuits 1-1 to 1-4 are provided for applying the results of the multiplications of the five data signals to the adder at the same timings. If the multiplication results reach the adder at the different timings, the adder improperly functions.

An example of the articles discussing the digital filter processing device is a paper entitled "A High Speed CMOS Digital Filter LSI for Video Signal Processing" by Hideki Kokubun et al., in THE INSTITUTE OF ELECTRONIC AND COMMUNICATION ENGINEERS OF JAPAN RESEARCH REPORT, SSD86-44.

The above prior art involves the following problems.

First, a quantitizing error (to be described in detail later) of the coefficient data set in each coefficient register is large. This error is amplified and accumulated during the course of the filter arithmetic operation, and finally the filter output data contains a large error.

Second, the decimal point of the filter output data is fixed at a value which depends on the coefficient data. Accordingly, the dynamic range (a range of expressible numerical values) of the filter output data is limited by the fixed decimal point.

(1) The first problem will be described.

To express the coefficient data necessary for an ideal filter processing in terms of a chain of bits, a length of the bit chain is infinite.

The coefficient registers 2-1 and the like for storing the coefficient data are equal in length of the bits. Consequently, of the coefficient data, only the data in the fixed bit length as counted from the most significant bit are stored in the registers. Such a process means the quantitizing of the coefficient data.

As the result of the quantitizing, a value of the data as expressed by a stream of bits, which includes the bit at the position where the fixed bit length terminates, and the bits at the positions of lower order than the position of the former bit is neglected. The neglected value is the error arising from the storage of the coefficient data (i.e., the error due to the quantitization of the coefficient data).

The first problem will be further described by using a specific example.

FIGS. 3(a) through 3(c) show explanatory diagrams useful in explaining how the coefficient data is stored in the coefficient register.

FIG. 3(a) indicates values of the coefficient data to be stored in the coefficient registers. The coefficient data $A_1$ is to be stored in the coefficient register 2-1. The coefficient data $A_2$ is to be stored in the coefficient register 2-2. In this instance, only 8 bits up to the 8th decimal place are written for the coefficient data $A_1$. Only 11 bits up to the 11th decimal place, for the coefficient data $A_2$. However, it can be considered that the bit stream of each data is followed by a stream of O's whose length is infinite.

In case that each coefficient register for storing the coefficient data, for example, the register 2.1 is an 8-bit one, the data to be stored is a part of the data as enclosed by a solid line as shown in FIG. 3(b). As seen, if the bit stream of the data from the first decimal place is stored, all of the bits shown in FIG. 3(a) are stored as for the coefficient data $A_1$, while the bits from the 9th to 11th decimal places are discarded as for the coefficient data $A_2$. The discarded bits constitute an error.

This error is amplified through the multiplication by the multiplier 3-1, and is added together with the errors outputted from the other multipliers, in the adder 4. As a consequence, the filter output data derived from the output terminal 7 inevitably contains an error.

(2) The second problem will be described in detail.

If the input data is an integer value, the position of the decimal point of the multiplication result outputted from the multiplier 3-1 is determined depending or the position of the decimal point of the coefficient data stored in the coefficient register 2-1. The same thing is true for the multiplication results of the remaining multipliers.

When the decimal point of the coefficient data is located at the position on the left side of the Nth bit as counted from the least significant bit, the decimal point of the multiplication result is located at the same position.

In the adder 4, the data in which the positions of the decimal points are thus determined are added together. Accordingly, the position of the decimal point of the filter output data resulting from the addition is automatically and fixedly determined by the position of the decimal point of the coefficient data.

This fact implies that a magnitude of the filter output data, viz., the dynamic range of it, is automatically determined by the position of the decimal point of the coefficient data.

The second problem will be further described using a specific example.

FIGS. 5(a) and 5(b) show explanatory diagrams for explaining how the dynamic range depends on the position of the decimal point. In the figure, each square indicates one bit. In the instance of FIG. 5, the filter output data consists of 10 bits. In the data of FIG. 5(a), the decimal point is located on the left side of the 4th bit position as counted from the least significant bit. The decimal point of the data of FIG. 5(b) is located on the left side of the 6th bit position as counted from the least significant bit. When comparing the two different data with each other, the data of FIG. 5(a) contains six bits to the left from the decimal point, while the data of FIG. 5(b) contains only four bits. A value that can be expressed by the data format of FIG. 5(a) is smaller than that by the data format of FIG. 5(b). The dynamic range of the data in FIG. 5 (a) is smaller than that in FIG. 5(b).

A desired dynamic range depends on a frequency band of the digital filter and a value of the coefficient data to be used. In the conventional digital filter processing device, the dynamic range is fixedly determined by the position of the decimal point of the coefficient data. Accordingly, it frequently fails to obtain a desired dynamic range.

SUMMARY OF THE INVENTION

Accordingly, an object of the present invention is to provide a digital filter processing device whose output data contains a less amount of error.

Another object of the present invention is to provide a digital filter processing device in which the dynamic range of the filter output data can be freely changed.

In summary, the present invention involves a digital filter processing device having at least a plurality of multipliers for multiplying data signal by coefficient data, and an adder for adding together the multiplication results derived from the multipliers, the digital filter processing device further including coefficient registers each for storing the coefficient data as is shifted so that its first effective digit lies at the left end, shift-quantity registers provided in connection with the coefficient registers, each for storing a quantity of shift equal to the quantity of the shift in each of the coefficient registers, and barrel shifters each for shifting the digits of the output data from each of the multipliers by the shift quantity stored in each of the shift-quantity registers in the opposite direction to that of the shift in each of the coefficient registers.

The digital filter processing device may further include a second shift-quantity register for storing a second quantity of shift, and a second barrel shifter for shifting the digits of the output data of the adder by the second shift quantity.

In the digital filter processing device thus arranged, the coefficient data as is shifted so that its first effective digit lies at the left end, is stored in the coefficient register. In other words, the digits that are not effective will not be stored in the register. Accordingly, the stages of the coefficient register can be effectively used, with storage of an increased number of the effective digits. This feature improves the precision of the multiplication using the coefficient data. That is, it minimizes the adverse effect by the error due to the quantitization of the coefficient data.

With the combination of the shift-quantity register and the barrel shifter, the multiplication result of each multiplier is shifted back by the shift quantity of the coefficient data as is stored in the coefficient register, so as to obtain a correct multiplication result.

With further provision of the second shift-quantity register and the second barrel register, the number of digits of the addition result that is to be shifted is set in the second shift-quantity register, and the addition result is shifted by the number of digits. In this way, a dynamic range of the addition result can be changed. The addition result is treated as the filter output data. Namely, a dynamic range of the filter output data can be freely changed.

A value of the coefficient data used for the digital filter processing and a frequency band for the digital filter processing sometimes request change of the dynamic range of the filter output data. The request can be satisfied by the feature resulting from the provision of the second shift-quantity register and the second barrel shifter.

Other objects and features of the present invention will be apparent when carefully reading the detailed description in connection with the accompanying drawings.

BRIEF DESCRIPTION OF THE DRAWINGS

FIGS. 3(a) through 3(c) are explanatory diagrams for explaining how to set coefficient data in coefficient registers;

FIG. 4 is a diagram showing a format of the output data of an adder; and

FIGS. 5(a) and 5(b) are explanatory diagrams for explaining how the position of a decimal point changes a dynamic range of the data.

DETAILED DESCRIPTION OF THE PREFERRED EMBODIMENT

A preferred embodiment of the present invention will be described with reference to the accompanying drawings.

Figure 1:
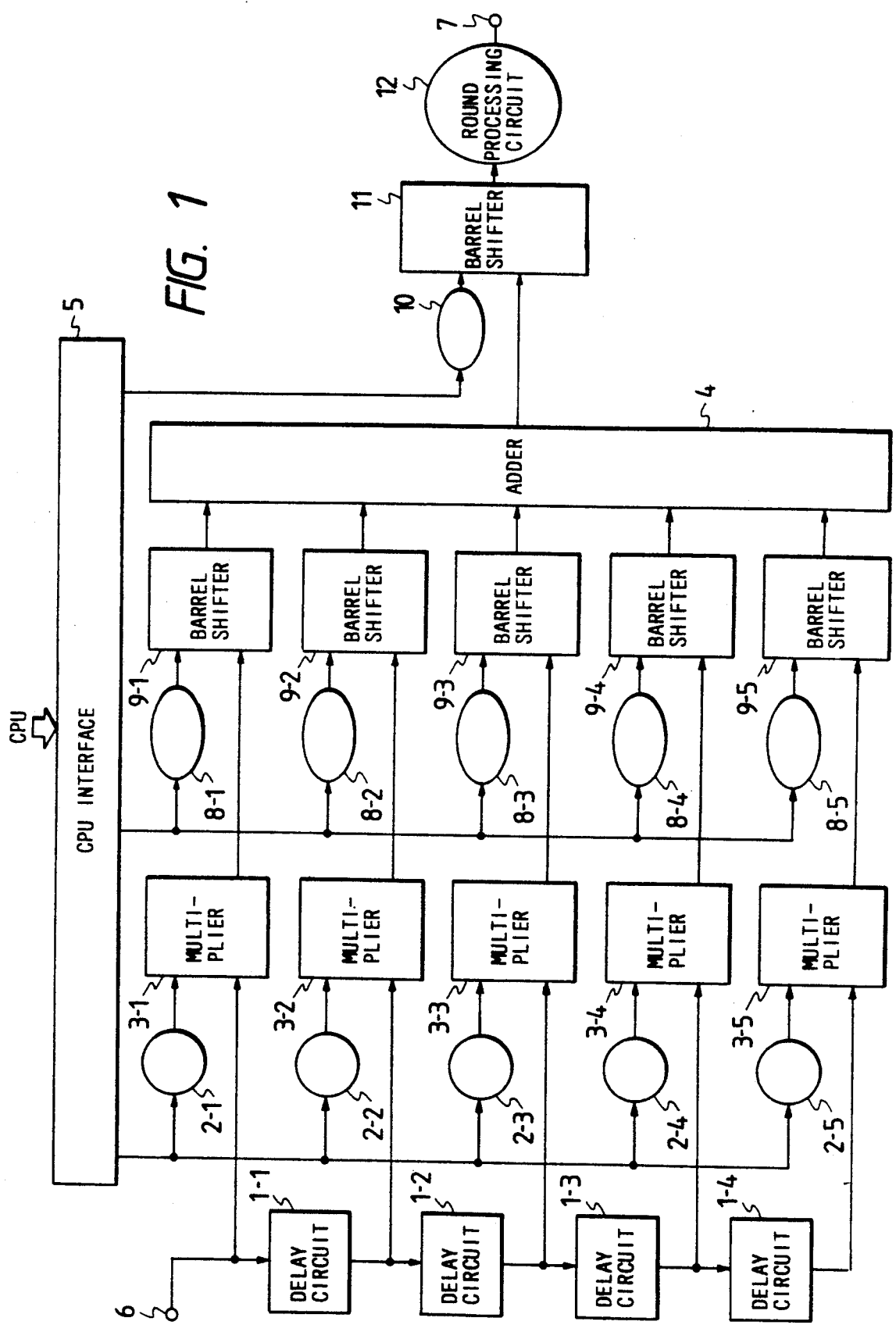
FIG. 1 is a block diagram of a digital filter processing device according to an embodiment of the present invention.
Figure 2:
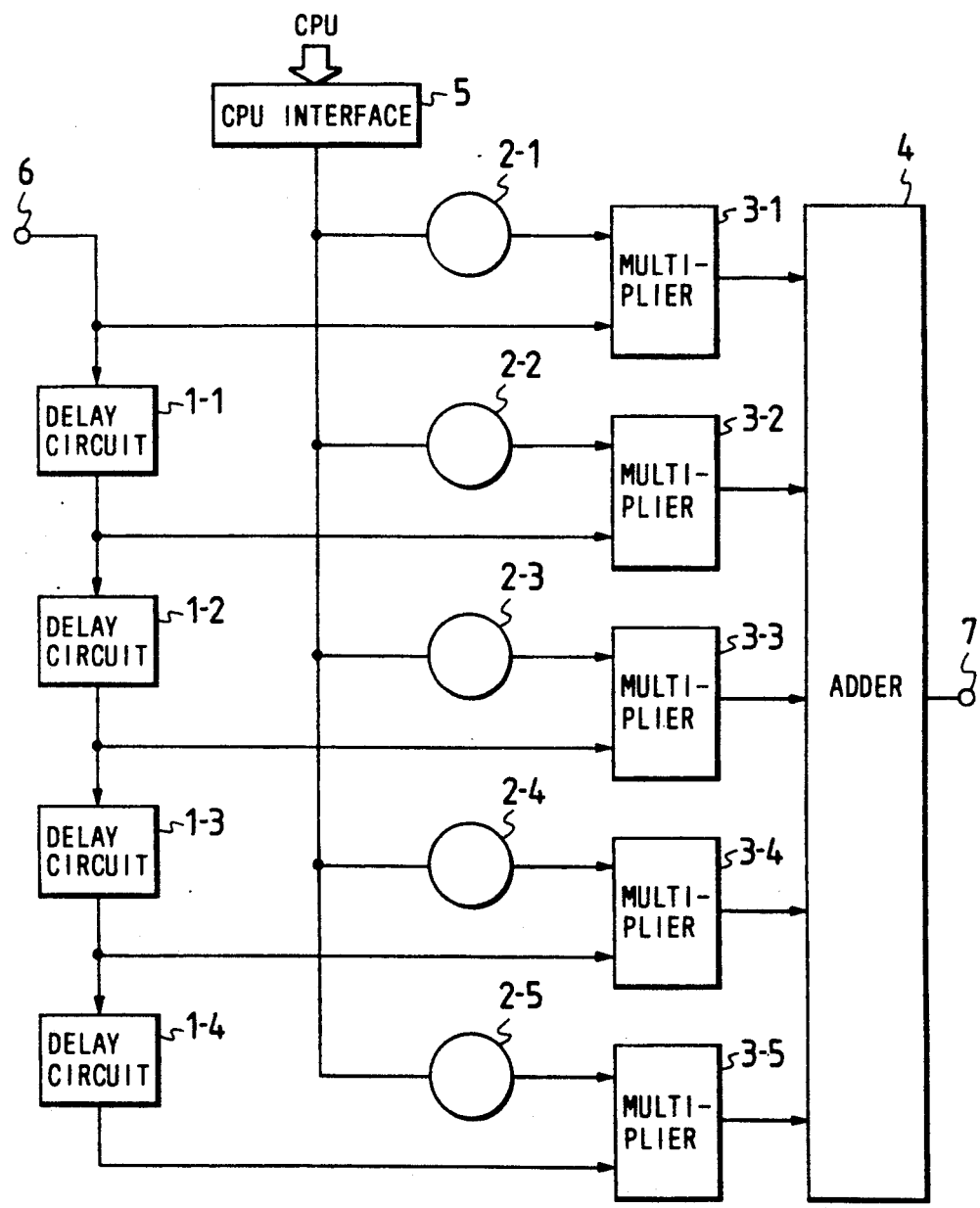
FIG. 2 is a block diagram of a conventional digital filter processing device.

An arrangement of a digital filter processing device according to the embodiment of the present invention is shown in FIG. 1. This device is a one-dimensional digital filter with five taps, like the conventional digital filter processing device shown in FIG. 2. In FIG. 1, reference symbols on numerals are used corresponding to those in FIG. 2. In FIG. 1, reference numeral 8-1 to 8-5 designate shift-quantity registers; 9-1 to 9-5, barrel shifters; 10, a shift-quantity register; 11, a barrel shifter; and 12, a round processing circuit.

(A) Outline of Device Operation

A data signal applied to an input terminal 6 is successively delayed by delay circuits 1-1 to 1-4. The signal data at the input terminal 6, and the output signals of the delay circuits 1-1 to 1-4 are multiplied by coefficient data set in coefficient registers 2-1 to 2-5, in multipliers 3-1 to 3-5.

An external CPU sets the coefficient data in the coefficient registers, through a CPU interface 5. In setting the coefficient data, the first effective digit and the consecutive digits are set in the registers. In case where the bits at the first decimal place are stored in the registers, and the first effective bit of the coefficient lies at the third decimal place, the data is shifted by 2 bits to the left, and is stored in the register.

In the barrel shifters 9-1 to 9-5, the output data of the multipliers 3-1 to 3-5 are respectively shifted by the number of bits as preset in the shift-quantity registers 8-1 to 8-5, that are provided in association with the multipliers. In each barrel shifter, the data is shifted by the same shift quantity as the preset shift quantity to the left and in the direction opposite to that of the shift when the coefficient data is set (in the above case, the coefficient data is shifted by 2 bits to the left or toward the side). In other words, the data shift by the barrel shift are high-order is to shift back the digits of the data to the original positions.

The number of bits to be set in the shift-quantity registers 8-1 to 8-5 are applied from the external CPU, through the CPU interface 5.

The output data of the barrel shifters 9-1 to 9-5 are added together by an adder 4. The output data of the adder 4 is shifted by the number of bits as set in the shift-quantity register 10, in the barrel shifter 11. The shift of the data here is for shifting the whole addition result to place the decimal point at a desired position. In other words, it is for setting a desired dynamic range.

Setting of the number of bits in the shift-quantity register 10 is performed by the CPU, through the CPU interface 5.

The output data of the barrel shifter 11 is applied to the round processing circuit 12. The circuit 12 rounds off a predetermined bit (e.g., the bit at the first decimal place). The data thus rounded is outputted as filter output data from an output terminal 7.

Following the description of the operation of the digital filter processing device, an extended elaboration of the operation will be given.

(B) How to Set Coefficient Data in Coefficient Registers

As referred to in the prior art description, the coefficient register has a fixed length of bits. Therefore, the coefficient data that is allowed to be stored in the register is limited within the bit width.

If the coefficient data to be set in the coefficient register contains the effective bits as many as possible, the precision of the multiplication result derived from the multiplier is improved. It is for this reason that in the present invention, of the original coefficient data, the bits on and after the first effective decimal digit are stored in the register.

How to store the coefficient data in the coefficient register will be described with reference to FIGS. 3(a) through 3(c).

In FIG. 3(a), coefficient data A is to be stored in the coefficient register 2-1, and coefficient data $A_2$ is to be stored in the coefficient register 2-2. The coefficient data A has a value expressed by 8 bits up to the 8th decimal place, and the coefficient data $A_2$ has likewise a value expressed by 11 bits up to the 11th decimal place.

A storage capacity of the coefficient register is not always enough to store all of the bits of given coefficient data. It is now assumed that each coefficient register has a capacity of 8 bits.

FIG. 3(b) shows how to store the coefficient data in the 8-bit coefficient register.

As for the coefficient data $A_1$, the effective bit ("1") appears in the first decimal place, and the data consists of 8 bits. In the present invention, the 8 bits at the first to 11th decimal places as enclosed by a solid line are stored in the register. As seen, the value of the coefficient data $A_1$, which is stored in the register, is equal to that in the conventional device.

As for the coefficient data $A_2$, the first effective bit appears in the fourth decimal place. Accordingly, 8 bits as counted from there, viz., the 4th to 11th bits at the decimal places enclosed by a dotted line, are stored.

FIG. 3(c) shows states of the data as thus stored in the coefficient registers 2-1 and 2—2.

In setting the value of 8 bits up to the 8th bit as counted from the first effective bit, if the next 9th bit is rounded off, the precision of the coefficient data can be improved.

(C) Shift Processing in Barrel Shifters 9-1 to 9-5

In the multiplication using the coefficient data as thus stored, one encounters the following problems.

If the coefficient data to be stored in the coefficient register has a value expressed by the bits in and after the first decimal place, the coefficient data $A_1$ as actually set in the coefficient register 2-1 is exactly equal to that value.

However, the coefficient data $A_2$ stored in the coefficient register 2—2 is not the case. As shown, the bit at the 4th decimal place is shifted to the position of the first decimal place. In other words, the data is shifted by three bits to the left. Therefore, the resultant value is eight times the actual value.

To correct the result of the multiplication that is performed by the multiplier 3-2 using the data of the coefficient register 2—2, it is necessary to shift the decimal point by the same quantity of shift as that at the time of storing the coefficient data in the register, and in the direction opposite to that at that time. In other words, it is necessary to shift the data by 3 bits to the right and hence to reduce the result of multiplication to a factor of eight.

To this end, the shift-quantity register 8-2 and the barrel shifter 9-2 are provided.

It is the shift-quantity register 8-2 that stores the number of bits, i.e., 3 bits, which are representative of a quantity of the shift to the right. It is the barrel shifter 9-2 that shifts the multiplication result by that shift quantity.

When the coefficient data $A_1$ is stored in the coefficient register 2-1, no shift of data is performed. Therefore, there is no need of shifting the result of multiplication by the multiplier 3-1. In this case, 0 bit is set in the corresponding shift-quantity register 8-1. Under this condition, no data shift is performed in the barrel shifter 9-1.

Of course, the description on the barrel shifters 9-1 and 9-2 are correspondingly applied to the remaining barrel shifters 9-3 to 9-5.

Thus, each of the barrel shifters 9-1 to 9-5 have a function to shift back the data as shifted when the coefficient data is stored, to the original position. In this way, the true multiplication result is obtained.

The multiplication results as decided as true multiplication results are added together in the adder 4.

(D) Data Shift by Barrel Shifter 11 and Round-off by Round Processing Circuit The output data of the adder 4 will first be described, since the barrel shifter 11 functions to shift the output data of the adder 4.

FIG. 4 shows an explanatory diagram useful in explaining the meaning of each bit of the output data of the adder 4. Hardware restriction limits the width of the output data of the adder 4 to a fixed width. In FIG. 4, each square indicates one bit, and a black dot indicates a decimal point.

A group $B_2$ of bits represents the filter output data as derived from the output terminal 7. A group B of high-order bits are used for detecting an overflow.

When an overflow of a positive value occurs, the overflow is detected in a manner that bit "1" is mixed into the bit group $B_1$ whose bits are all "0" when no overflow occurs. When an overflow of a negative value occurs, the overflow is detected in a manner that bit "0" is mixed into the bit group $B_1$ whose bits are all "1'" when no overflow occurs.

In case where an integral value is required as of the filter output data must be a positive value, and the output data the bit in the first decimal place is rounded off to improve the precision of, a group $B_3$ of bits which lie in and after the second decimal place are unnecessary.

As recalled, because of the hardware restriction, the output data of the adder 4 must have a fixed bit width. If the input data to the input terminal 6 is an integral value expressed by a certain number of bits, an integral value consisting of the same number of bits as that of the input data is required for the filter output data. Taking this into account, a required dynamic range must be wide enough to express at least that integral value.

In a high-pass filter in which a value of the coefficient data is relatively large, the dynamic range of the addition result is likely to be large. Because of this, there is a request to increase the bit width for detecting the overflow. To realize that, it is desirable to place the decimal point to the right (toward the lower order) as much as possible within the fixed bit width.

In a low-pass filter in which a value of the coefficient data is relatively small, a designer desires that the bit width for the overflow detection is narrow, but the bit width of those bits in and after the first decimal place is wide. To realize that, it is desirable to place the decimal point to the left (toward the higher order) as much as possible within the fixed bit width.

To meet those requests, the digital filter processing device according to the present invention is arranged such that a quantity of shift of the decimal point is preset in the shift-quantity register 10, and the barrel shifter 11 shifts the whole output data of the adder 4, thereby to affect the shift of the decimal point.

A value to be preset is loaded in the register 10 through the CPU interface 5, from the external CPU.

For example, in case that the decimal point of the output data of the adder 4 is placed between the 8-th bit and the 9th bit as counted from the least significant bit, and that an integral value is required for the filter output data, the following procedure is taken.

To obtain an integral value, the bit in the first decimal place is to be rounded off, and the bits after the first decimal place are unnecessary. Hence, the bit in the first decimal place is shifted to be placed at the least significant position. At this time, a quantity of data shift required is 7 bits toward the lower place. This shift quantity is set in the shift-quantity register 10.

The barrel shifter 11 shifts the output data of the adder 4 by the quantity of shift (7 bits) as stored in the register 10. As a result, the decimal point is placed at the position between the least significant bit and the next bit.

The above example relates to a case where the filter output data is an integral value. If required, by changing the quantity of data shift in the barrel shifter 11, a desired number of bits after the decimal point can be obtained. This implies that the position of the decimal point can be changed in accordance with the format of the required filter output data. In other words, the dynamic range of the filter output data can be changed in accordance with the format of the required filter output data.

The round processing circuit 12 executes a round processing and a processing for overflow.

The components subsequent to the adder 4, that is, the shift-quantity register 10, barrel shifter 11 and the round processing circuit 12, may be removed from the arrangement of the embodiment shown in FIG. 1, if required. If so, the resultant arrangement also functions as a digital filter processing device.

In this case, however, the digital filter processing device is capable of minimizing the adverse effect by the quantitizing error of the coefficient data, but is incapable of freely changing the dynamic range.

As seen from the foregoing description, the digital filter processing device according to the present invention has the following advantageous effects.

(1) It is possible to minimize an error of the filter output data due to the quantitizing error of the coefficient data.

In setting the coefficient data in the coefficient register, of the bits constituting the coefficient data, the bits in the first effective position and the subsequent ones are stored. Therefore, the precision of the multiplication performed using the coefficient data stored is improved. And the error of the filter output data is proportionally reduced.

(2) It is possible to change freely the dynamic range of the filter output data.

The result of the addition at the final stage of the digital filter processing may be shifted in the higher-order or the lower-order bit direction by the shift-quantity register 10 and the barrel shifter 11. In other words, the position of the decimal point may be changed freely.

Therefore, the dynamic range of the filter output data can be appropriately changed in accordance with the frequency band of the filter and the coefficient data used.

(3) As described above, the decimal point of the addition result is adjusted within the digital filter processing device. Therefore, if the digital filter processing device is fabricated into an integrated circuit, the exceptional processing performed in the next stage, such as the round processing and the overflow processing, can be performed within the integrated circuit.

While the present invention has been described using specific embodiments, it should be understood that the present invention may variously be changed and modified within the spirit and scope of the appended claims.

What is claimed is:

1. A digital filter processing device comprising:
   delay means for successively delaying a received data signal;
   coefficient registers each for storing coefficient data as is shifted so that a first effective digit of the coefficient data lies at the left end;
   multipliers each for multiplying said data signal from said delay means by the shifted coefficient data stored in the corresponding one of said coefficient registers;

shift-quantity registers corresponding to said coefficient registers, and each for storing a quantity of shift equal to the shift quantity of the coefficient data;

barrel shifters each for shifting the digits of an output data from each of said multipliers by the shift quantity stored in each of said shift-quantity registers, in the opposite direction to that of the shift in each of said coefficient registers; and an adder for adding together output data from said barrel shifters.

2. A digital filter processing device according to claim 1, further comprising a second shift-quantity register for storing a second quantity of shift, and a second barrel shifter of shifting the digits of output data from said adder by the second shift quantity stored in said second shift-quantity register.

* * * * *

UNITED STATES PATENT AND TRADEMARK OFFICE
CERTIFICATE OF CORRECTION

PATENT NO. : 5,029,121

DATED : July 02, 1991

INVENTOR(S) : Tetsuro KAWATA et al.

It is certified that error appears in the above-identified patent and that said Letters Patent is hereby corrected as shown below:

Claim 2, column 10, line 6, change "of" (first occurrence) to --for--.

Signed and Sealed this

Thirtieth Day of March, 1993

Attest:

STEPHEN G. KUNIN

*Attesting Officer*   *Acting Commissioner of Patents and Trademarks*